(12) United States Patent
Suzuki et al.

(10) Patent No.: US 6,324,195 B1
(45) Date of Patent: Nov. 27, 2001

(54) LASER PROCESSING OF A THIN FILM

(75) Inventors: Takayuki Suzuki, Shiga; Masataka Kondo, Kobe, both of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/326,743

(22) Filed: Jun. 4, 1999

(30) Foreign Application Priority Data

Jan. 13, 1999 (JP) .................................................. 11-006814
Jan. 13, 1999 (JP) .................................................. 11-006815

(51) Int. Cl.[7] ...................................................... H01S 3/10
(52) U.S. Cl. .................................... 372/25; 372/7; 372/10
(58) Field of Search ................................ 372/7, 25, 69, 372/70, 10

(56) References Cited

U.S. PATENT DOCUMENTS

| 5,533,040 | * | 7/1996 | Zhang ..................................... | 372/25 |
| 5,553,040 | | 9/1996 | Shang . | |
| 5,812,569 | * | 9/1998 | Walker et al. .......................... | 372/25 |
| 6,038,240 | * | 3/2000 | Deutsch et al. ........................ | 372/25 |
| 6,038,241 | * | 3/2000 | von Elm et al. ....................... | 372/25 |

FOREIGN PATENT DOCUMENTS

| 50-5345 U | 2/1975 | (JP) | ................................ | H01S/3/091 |
| 1-192492 | 8/1989 | (JP) | ................................ | B23K/26/00 |
| 1-302881 | 12/1989 | (JP) | ................................ | H01S/3/10 |
| 4-43314 | 2/1992 | (JP) | ................................ | G02B/27/10 |
| 4-135083 | 5/1992 | (JP) | ................................ | B23K/26/00 |
| 4-190988 | 7/1992 | (JP) | ................................ | B23K/26/00 |
| 5-286 U | 1/1993 | (JP) | ................................ | B23K/26/06 |
| 6-114577 | 4/1994 | (JP) | ................................ | B23K/26/00 |
| 8-340165 | 12/1996 | (JP) | ................................ | H05K/3/00 |
| 10-12901 | 1/1998 | (JP) | ................................ | H01L/31/04 |
| 10-99987 | 4/1998 | (JP) | ................................ | H01S/3/10 |

\* cited by examiner

Primary Examiner—Leon Scott, Jr.
(74) Attorney, Agent, or Firm—Hogan & Hartson LLP

(57) ABSTRACT

Method and apparatus for processing a workpiece having a thin film layer using laser pulses generated by a plurality of lasers. The lasers are equipped with Q-switches and triggered by a Q-switch trigger device at controlled pulse frequencies and delays with respect to one another. The laser pulses from the plurality of lasers are directed to the same processing spot on the workpiece to generate a combined laser beam, and the workpiece is moved relative to the laser beam to process the thin film with the laser pulses. The method and apparatus increase the processing speed and accomplish multiple-step processing in a single pass. Application of the invention in the fabrication of thin film solar cells is described.

23 Claims, 6 Drawing Sheets

TIME

LASER PROCESSING OF A THIN FILM

BACKGROUND OF THE INVENTION

1. Field of the Invention

This invention relates to a method and apparatus for processing a thin film formed on a substrate using a laser beam.

2. Description of the Related Art

Laser devices are widely used in the processing of materials such as cutting, welding, surface treating, and removing of materials from the surface of a substrate. The removal of materials from the surface of a substrate requires applying a beam of laser light having a frequency within the absorption ranges of the material, either directly onto the material itself or through the surfaces of transparent substrate or a transparent film. The laser energy is absorbed by the subject material and converted to heat energy, whereby the material is removed by being thermally altered or vaporized. For example, Japanese Laid-Open Application Sho 61-14727 describes removing a thin film formed on the surface of a transparent substrate by applying a laser beam onto the thin film to vaporize or to initiate a peeling action to remove the thin film from the substrate surface. These technologies can be effective in the precise fabrication of large size substrates, and are used actively in pattern generation in the fabrication of plasma display (PDP) units and thin film solar cells.

Japanese Laid-Open Application Sho 57-1256 describes fabricating a solar cell using laser patterning technology to produce multiple series connections for rectangular stripe-shaped thin film solar cell elements to form an integrated structure. The integrated structure is formed by forming a plurality of rectangular stripe-shaped transparent electrodes on a transparent substrate, the electrodes being divided by a plurality of equally spaced first isolation lines. A semiconductor layer that converts light energy to produce an electromotive force is then formed on the transparent electrodes, and divided into stripe-shaped elements separated by a plurality of second isolation lines. The second isolation lines are equally spaced at the same spacing as the first isolation lines, and are located at positions adjacent but offset from the first isolation lines. A backside electrode layer is then formed on the semiconductor layer, and divided into stripe-shaped elements by a plurality of third isolation lines. The third isolation lines are again equally spaced at the same spacing as the first isolation lines, and located at positions offset from the second isolation lines on the opposite side of the first isolation lines. The neighboring elements of transparent electrode stripes and backside electrode stripes are connected at the areas of the second isolation lines. As a result, a structure having a plurality of elements connected in series is formed.

The integrated structure described above, as well as alternative structures where the backside electrode layer and the semiconductor layer are separated by a plurality of third isolation lines, have been used since the 1980s. Both of these structures are equipped with electrodes located at both ends of the row of the series-connected solar cell elements for the purpose of drawing out the generated electrical power. The edges of the substrate typically have unusable border areas of 5 to 10 mm in width that can not be used for power generating, since the physical framing of the module will shade out these border areas. In addition, a frame holding area is required during the semiconductor and backside electrode fabrication processes which also masks out a certain amount of the edge portions.

In the past, the transparent electrodes were fabricated from a film of ITO (indium-tin-oxide) using a conventional evaporation technique, but it is now more common to fabricate the transparent electrode with $SnO_2$ (tin oxide) thin film using a process known as thermal CVD. Since the thermal CVD process can not be applied selectively using a mask, the entire substrate surface is therefore covered with the tin oxide layer. The electrode areas and power generating areas must therefore be electrically insulated from the peripheral boundary where electrical conductors are present. One way to achieve such insulation is to install isolation separator lines which partially remove the transparent electrode from the areas surrounding the power generating area and the backside electrode area. The width of the isolation separator lines should be a minimum of 100 $\mu$m, so that when the solar cell elements are encapsulated with an organic molding compound, the insulation can withstand a voltage of 1500 V and function reliably. Japanese Laid Open Application Hei 8-83919 describes a method of producing isolation separator lines having proper widths by running laser scribing lines several times on the substrate surface.

Thin film solar cell modules fabricated as described above may be sealed with a vacuum lamination method by piling an ethylene vinyl acetate (EVA) type laminated polymer sheet and a polyvinyl fluoride polymer sheet (Tedlar®) on the thin film solar cells. The solar cell modules may be completed by attaching a terminal box and an aluminum frame.

As described above, laser processing is an extremely effective pattern generating tool in the fabrication of solar cells. However, a major drawback of this process is that it is slow and cumbersome, since a single laser beam is used with a single point source running on the substrate. In addition, if the material to be processed by the laser is thick, repeated applications of the laser beam will be required. This requires the moving mechanisms to be highly accurate and reproducible, increasing the complexity and cost of the processing devices.

Typically, a laser device is capable of producing continuous power generation. However, when the materials being processed require a highly amplified and focused beam, a giant pulse laser method is typically used. In a giant pulse laser process, the energy is stored in the laser medium, and the light is generated by a Q-switch when an adequate amount of energy is accumulated. Pulse lasers such as excimer lasers are ideal for the types of material processing described above, since pulse lasers can typically generate pulses only, and the laser generation only exists for short periods of time.

Laser processing may be carried out by moving the substrate relative to the laser beam. Recent advancements in mechanical devices have made it possible to move the substrate at a speed of 100 cm/sec. However, the pulse frequency of a Q-switch operated laser is limited. Thus, to produce a trace of overlapping light spots using a single high-intensity focused beam, the substrate must move at an appropriate speed determined by the optimum frequency of the laser pulses, which is typically slower than the speed attainable by the mechanical structure. This reduces the speed of the processing. For instance, to process a tin oxide layer applied on a glass surface using a commonly available neodymium YAG laser with a power rating of 2 W at 10 kHz and a beam spot of 50 $\mu$m in diameter, the upper limit of the processing speed is about 50 cm/sec (50 $\mu$m×10,000/sec). Because of the need to overlap the beam spots, the actual speed will be about 40 cm/sec. To increase the processing speed, the laser pulse frequency must be increased. For example, if the processing speed is to be doubled, the laser pulse frequency must be increased to about 4 W at 20 kHz.

In addition, the amount of energy in each laser spot at the working site must be maintained. It is difficult to produce a laser device meeting such requirements. A YVO$_2$ laser with a high Q-switch frequency of 100 kHz is available, but its power is an order of magnitude too low to meet the above power requirement.

While 50 cm/sec might appear to be a high speed, it is insufficient for solar cell processing. For example, to fabricate a 1 m$^2$ solar cell module with 10 mm wide solar cell elements, a laser running distance of over 100 m is required, which theoretically takes 200 seconds to complete. In reality the cycle time is more like 5 minutes, making mass production problematic.

Moreover, the above-described processing speed can only be achieved for processing thin film layers of less than 1 μm, where a single pass of the laser beam suffices. To process thicker layers, such as CdTe layers, or the increasingly popular polycrystalline silicon (poly-Si) layers which are typically over 2 μm in thickness, the laser beam must traverse the same film area twice or more, further increasing the processing time. In addition, when the laser beam is applied two or more times over the same area, the beam must be accurately repositioned, typically to within 10 μm from the previous laser spots. Such requirements increase the complexity and cost of the processing device.

SUMMARY OF THE INVENTION

To increase the processing speed, it has been proposed to use multiple laser beams simultaneously applied on the substrate surface at different processing points. But actual application has long been prevented by problems such as the difficulties in obtaining accurate positioning of the multiple beam spots with respect to each other and with respect to the substrate.

It is therefore an object of the present invention to provide a laser processing method and apparatus that substantially obviates one or more of the problems due to the limitations and disadvantages of the related art.

An object of the present invention is to provide a laser processing device and method that enhances the processing speed.

Another object of the present invention is to provide a laser processing device and method that enables multiple laser processing in a single pass and with enhanced processing speed and mechanical precision.

Additional features and advantages of the invention will be set forth in the description which follows and in part will be apparent from the description, or may be learned by practice of the invention. The objectives and other advantages of the invention will be realized and attained by the structure particularly pointed out in the written description and claims as well as the appended drawings.

To achieve these and other advantages and in accordance with the purpose of the present invention, as embodied and broadly described, a laser processing apparatus comprises a plurality of laser generators having Q-switches for generating laser pulses, a Q-switch trigger device coupled to the laser generators for triggering the laser generators and controlling the timing of the pulse generation of the laser generators, and an optical system for directing the pulses generated by the plurality of laser generators onto substantially the same spot on a plane defined by the surface of the workpiece. The optical device may comprise a plurality of partial reflecting mirrors, or a rotating mirror for directing the pulses from the plurality of lasers onto a common axis.

In another aspect, the present invention provides a laser processing method for processing a thin film formed on a surface of a workpiece, by irradiating laser pulses on the thin film to at least partially remove the thin film from the surface of the workpiece, the laser pulses having wavelengths within the absorption range of the thin film, wherein the laser pulses are generated by a plurality of laser generators having Q-switches, wherein the laser pulses from the plurality of laser generators are directed by an optical system onto substantially the same spot on a plane defined by the surface of the workpiece, and wherein the Q-switches of the plurality of lasers are operated in a synchronized manner and the timing of the pulse generation of the plurality of lasers is adjustable relative to each other.

The plurality of lasers and their associated focusing optics may be identical or different in terms of the type of laser, wavelength, power, spot size, etc. In addition, multiple processing of the workpiece in a single pass can be accomplished by an appropriate optical setup and timing control of the multiple lasers. In this case, using different lasers enables multiple processing steps with different lasers to be carried out in a single pass.

It is to be understood that both the foregoing general description and the following detailed description are exemplary and explanatory and are intended to provide further explanation of the invention as claimed.

DETAILED DESCRIPTION OF THE PREFERRED EMBODIMENTS

Figure 1:
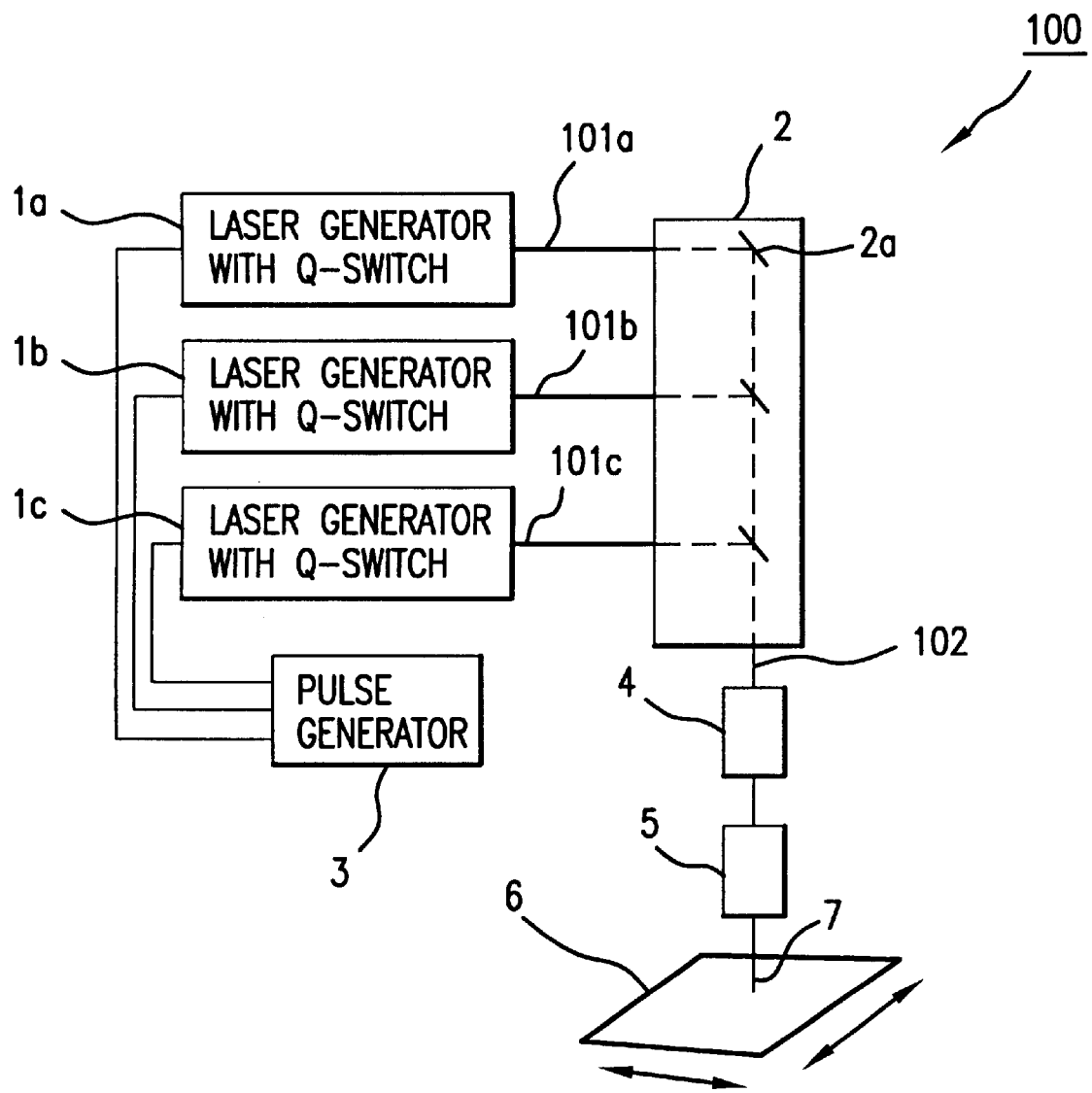
FIG. 1 is a schematic diagram of a laser processing apparatus for fabricating a thin film multilayer structure according to a first embodiment of the present invention.

Referring to FIG. 1, a laser processing device 100 according to a first embodiment of the present invention includes a plurality of laser generators 1a–1c for generating a plurality of laser beams 101a–101c. The laser beams 101a–101c are converted to wide parallel beams by collimators and emitted into focusing optics 2, and three beams are emitted from the optics 2 as a bundle 102 along a common optical axis. The focusing optics 2 may use partial reflecting mirrors, a rotating mirror, "butterfly" type of mirrors that can be switched in and out of the optical path, etc. The combined beam 102 emitted from the focusing optics 2 is adjusted to a desired intensity by an attenuator and emission optics 4 and directed to processing optics 5. The laser beam is condensed by the processing optics 5 and directed to the working surface of the substrate at a processing point 7. Optics 4 and 5 may be optical devices that are commercially available. The substrate may be mounted on a processing table such as a scanner 6, and laser processing is carried out by moving the substrate relative to the processing laser beam.

The laser generators 1a–1c may be any suitable types of lasers known in the art, and are equipped with Q-switch timing and trigger devices. Laser models capable of controlling the timing of laser generation by external triggering devices are commercially available. An external pulse generator 3 is provided for controlling the timing of the Q-switch triggering devices of the lasers 1a–1c.

Figure 2A:
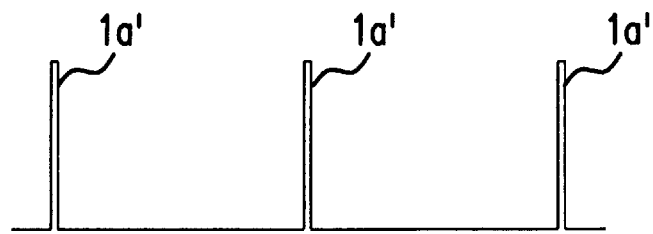
FIGS. 2a–2d illustrate the timing of the laser pulse sequences according to the first embodiment of the present invention.
Figure 2B:
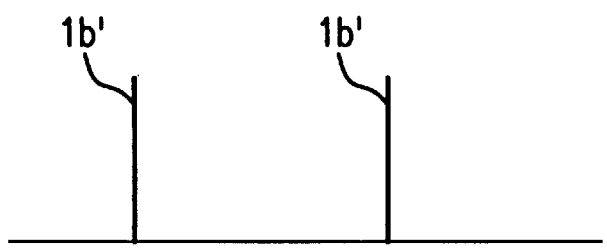
Figure 2C:
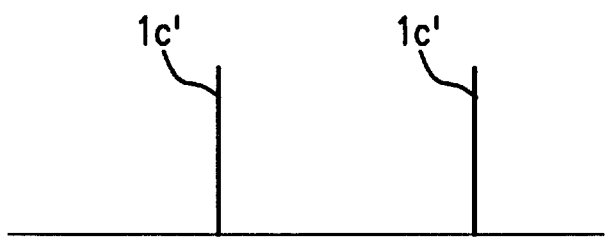
Figure 2D:
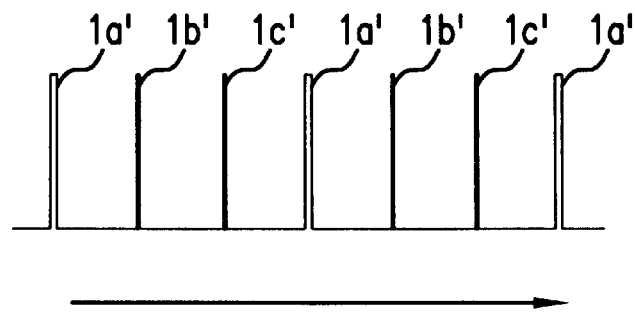

Although FIG. 1 illustrates the three laser beams 101a–101c as being combined into a single beam 102, in reality the Q-switch trigger device 3 controls the laser generators 1a–1c to sequentially delay the laser pulses generated by the three lasers so that laser pulses are continuously emitted at preset intervals. Therefore, only one laser pulse is generated at one time as illustrated in FIGS. 2a–2d. FIGS. 2a–2c show the timing sequence of the pulse trains 1a', 1b' and 1c' generation by lasers 1a, 1b and 1c, respectively, and FIG. 2d shows the laser pulses in the laser beam 102 emitted from the collimating and focusing optics 2.

If, for example, the pulse frequency of each of the Q-switched lasers 1a–1c is 1 kHz, then the interval between pulses is 1 msec in each of the pulse trains 1a'–1c'. If the pulse train 1b' is delayed by 333 μsec with respect to the pulse train 1a' and the pulse train 1c' is delayed by 667 μsec with respect to the pulse train 1a', the laser beam emitted by the focusing optics 2 and received at the processing point 7 will have a pulse interval of 333 μsec, or a frequency of 3 kHz, corresponding to a laser power three times that of each of the lasers 1a–1c.

Although three lasers are shown in FIGS. 1 and 2, it will be recognized that a different number of lasers can be used. If N lasers are used, each emitting at the same pulse frequency and same power, then the frequency and power of the laser beam 102 outputted from the focusing optics 2 will be N times the frequency and total power of each individual lasers.

Figure 3:
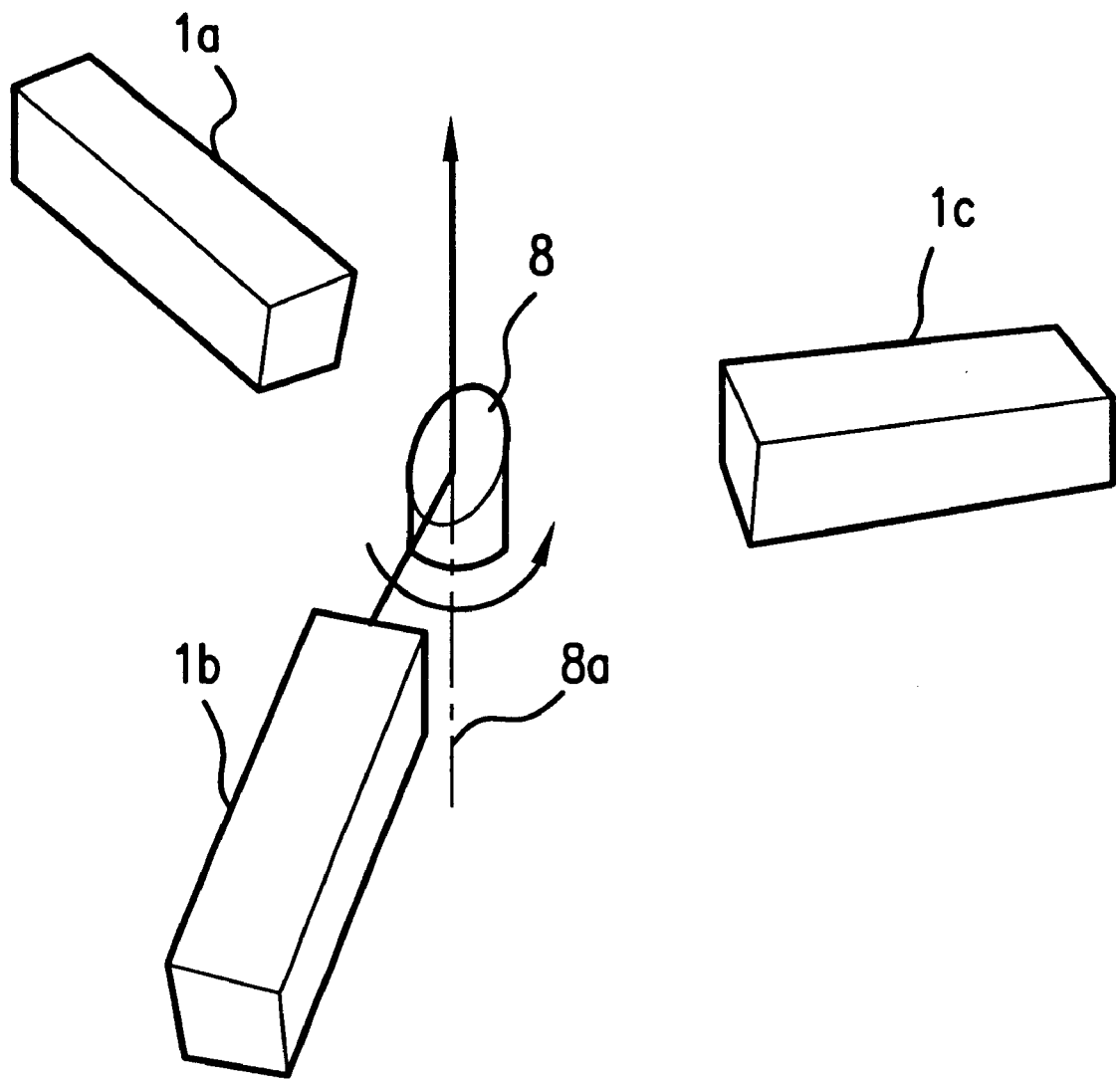
FIG. 3 schematically illustrates an optical device for combining a plurality of laser beams into one beam according to the first embodiment of the present invention.

In the focusing optics 2, partial reflecting mirrors 2a may be used to combine the laser beams from the plurality of lasers into one beam, as shown in FIG. 1. Alternatively, a rotating mirror may be used. In an example shown in FIG. 3, a conventional 90-degree reflecting mirror 8 rotates as indicated by the arrow about an axis 8a perpendicular to the plane in which the individual laser beams lie. In this approach, the lasers 1a–1c are triggered to fire at precise moments when the mirror 8 is rotated to a proper location facing the firing laser. The rotating mirror 8 shown in FIG. 3 may be more preferred than the partial reflecting mirrors 2a shown in FIG. 1, provided that the frequency and synchronization of the rotation of the mirror 8 can be precisely controlled.

The embodiment described above can be applied in cases where a previously combined laser beam is split into several different processing points. That is, laser beams from N lasers may be combined into one beam using the apparatus according to the described embodiment, and subsequently split into M beams. As compared with processing methods using one laser device with one beam, it is possible to process a workpiece at a speed N×M as fast.

The laser devices that can be used in the above described embodiment include Nd:YAG laser, second and third harmonic Nd:YAG lasers (i.e., frequency-doubled or tripled Nd:YAG lasers), excimer laser, $YVO_2$ laser and the like.

Figure 4A:
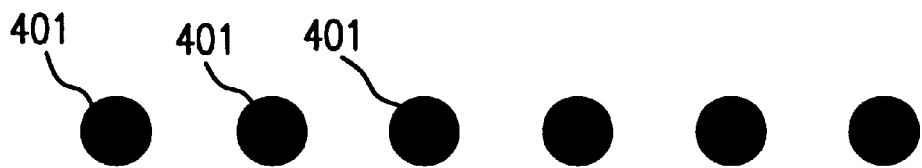
FIGS. 4a and 4b show traces of laser pulses generated by a conventional laser process device having a single laser generator and by a device according to the first embodiment of the present invention, respectively.
Figure 4B:
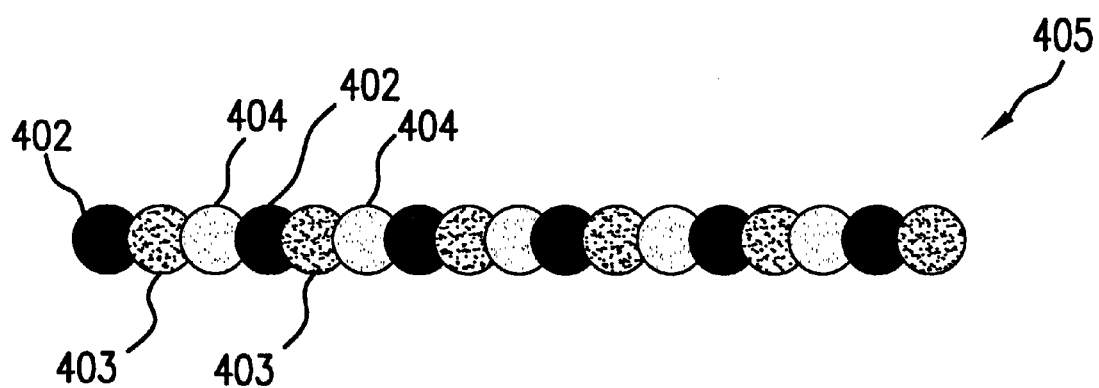

FIGS. 4a and 4b show a comparison between a laser processing method according to embodiments of the present invention and the conventional method using a single laser, where the speed of the substrate movement is the same in both cases. The spots 401–404 schematically represent the spots formed by the laser pulses on the workpiece at the processing position 7 (FIG. 1). In the conventional method (FIG. 4a), the laser spots 401 are disconnected, resulting in a dotted line. On the other hand, when three lasers are used according to methods of the present invention (FIG. 4b), the spots formed by the laser pulses are connected with each other to form a continuous line 405. In FIG. 4b, the three sets of spots 402, 403 and 404 originate from the three lasers 1a–1c, respectively.

In an alternative embodiment, the plurality of lasers 1a–1c are triggered simultaneously without delay with respect to each other. In this case, the combined laser beam has the same pulse frequency as the individual laser beams, but a higher power. For this embodiment, the optical arrangement using partial reflecting mirrors shown in FIG. 1 is used in lieu of the rotating mirror arrangement shown in FIG. 3. In addition, for this embodiment, the individual lasers used may have either the same or different power levels. This embodiment is particularly useful when the individual lasers 1a–1c have a high pulse frequency but relatively low power, such as $YVO_2$ lasers as mentioned above, as the resulting processing beam will have sufficiently high frequency as well as power.

Alternatively, the pulse frequencies of the plurality of lasers may be different. In this case, their frequencies are preferably integral multiples of a common frequency.

In yet another alternative embodiment, the multiple beams from lasers 1a–1c may be optically combined so that their optical axes are slightly offset instead of exactly coinciding. The substrate may be moved in the direction perpendicular to the offset direction of the beams, and a wider area can be processed in each scan. Those skilled in the art will recognize that this embodiment may be combined with any of the alternative embodiments described earlier. For example, the lasers may be triggered with or without delay with respect to each other. In addition, the scan may also be in the same direction as the offset of the beams.

Described below is a practical example of fabricating a thin film solar cell on a glass substrate using multiple lasers according to the first embodiment of the present invention.

FIGS. 5a–5d show in cross sectional views the processing steps for fabricating a thin film solar cell. First, a transparent electrode layer 10a was formed on a glass substrate 9. The transparent electrode layer 10a may be formed of electrically conductive oxide material such as zinc oxide or fluoride doped tin oxide, and may be formed by a thermal CVD process or other suitable processes well known in the art. A laser beam was then used to form isolation lines 10b in the transparent electrode layer 10a, thereby dividing the transparent electrode layer 10a into individual stripe-shaped electrode elements 10. In the illustrated example, the transparent electrode layer 10 was formed of tin oxide of about 1 μm in thickness on the substrate 9 of about 2 mm thick. Nd:YAG lasers were used to form the isolation lines 10b. Since the vaporization temperature of tin oxide is quite high, high intensity laser beams are required. Thus, three laser devices each having a Q-switched frequency of 10 kHz and an output power of 4 W were used for processing. The size of the laser beam spots were focused down to 50 μm to provide high-energy density spots. With the above setup, a processing speed of about 100 cm/sec was obtained.

Figure 5A:
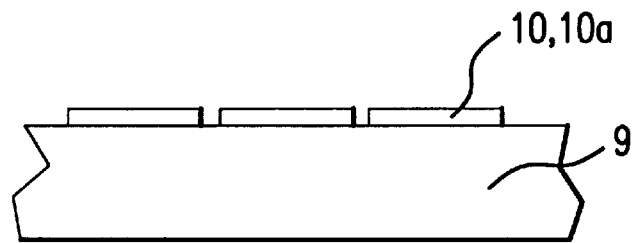
FIGS. 5a–5d illustrate processing steps for fabricating a thin film solar cell according to the first embodiment of the present invention.
Figure 5B:
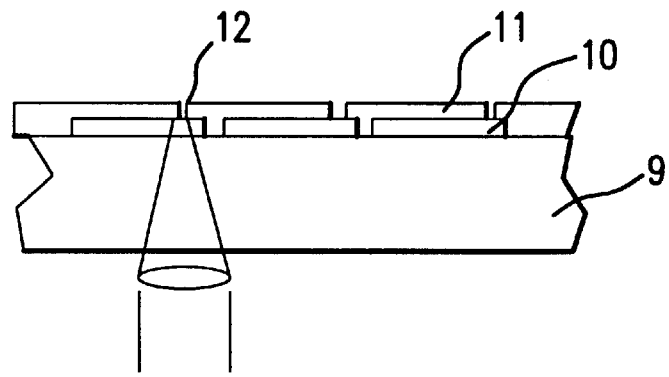

A photoelectric conversion layer 11 of amorphous silicon is formed over the stripe-shaped transparent electrodes 10 (FIG. 5(b)). This process may be accomplished by an RF glow discharge method in a silane gas atmosphere. In the illustrated example, the amorphous layer 11 was about 0.5 µm thick. P-i-n junctions (not shown) are formed in the semiconductor layer 11 by using diborane and phosphine as the doping gases. To form serial connection of the thin film solar cell elements with the stripe-shaped electrodes 10, the silicon in the photoelectric conversion layer 11 is selectively removed to form isolation lines 12 adjacent the lines 10b in the transparent electrode layer. For this processing step, the green light of a second harmonic Nd:YAG laser is preferably used because of the high absorption of the silicon layer in that wavelength range. As shown in FIG. 5(b), the laser beam may be irradiated through the glass substrate 9 and the transparent electrodes 10. The size of the laser beam spot was 100 µm.

The removed portions 12 need not be straight lines, and the semiconductor layer will be vaporized by heat created at the surface between the transparent electrode and the semiconductor layer. Due to the short laser pulses, typically shorter than 200 nsec in duration, a large thermal gradient is created, and it is possible to quickly vaporize the materials to be removed. In the inventors' experience, laser processing using a laser beam that generates scattered dotted lines appeared to be acceptable. In addition, a strong and reliable adhesion between the transparent electrodes 10 and the semiconductor layer 11 is critical in order to withstand the stress applied to the solar cell module when attaching the metal components during final assembly. To accomplish this strong adhesion, it is preferred that the beam energy rise very quickly, and a $TEM_{00}$ beam focused to a spot size of 100 µm was found to be suitable.

As mentioned previously, for this particular laser processing, it was acceptable to use scattered laser spots. The inventors were able to use a single laser with a Q-switched frequency of 10 kHz and an output power of 2 W to process the semiconductor layer 11 at a processing speed of 100 cm/sec.

Figure 5C:
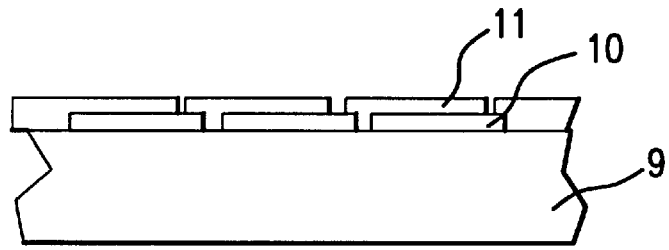
Figure 5D:
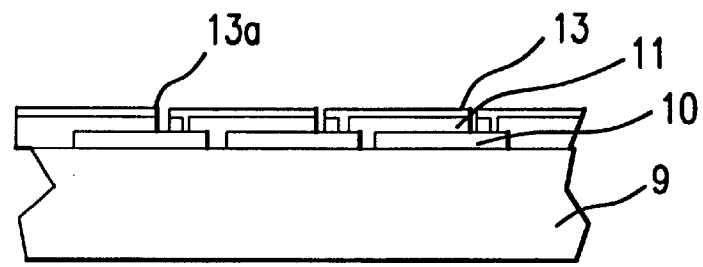

FIG. 5(c) illustrates the condition of the solar cell device after this processing step. FIG. 5(d) shows a completed thin film solar cell module where backside electrodes 13 are formed, and isolated by removing the backside electrode to form isolation lines that are offset from the isolation lines 10b formed in the transparent electrode layer as well as the dotted isolation lines 12 formed in the semiconductor layer. The backside electrodes are formed of laminated layers of approximately 0.1 µm of ZnO and approximately 0.2 µm of aluminum. The laminated structure increases the light reflectivity of the backside electrode to trap the solar energy in the semiconductor to maximize the power conversion efficiency. The removed portions or isolation lines 13a of backside electrodes must be continuous lines. To form the isolation lines 13a, a laser beam having a spot size of about 100 µm and a Q-switch frequency of 10 kHz was used. Two laser generators each having an output power of 2 W were used to generate the laser beam, and a processing speed of 100 cm/sec was obtained.

In this example, the laser optics are fixed and the working table on which the substrate is placed was scanned in the X and Y directions. In order to assure accurate movement, the moving mechanism of the working table was equipped with ball screws, and a glass scale used to detect the position setting. The ball screw equipped motor, which controls the movement of the working table, has a closed-loop feedback control mechanism to assure accurate repeatability of the movements.

A second embodiment of the present invention is described below with reference to FIGS. 6a–6d and 7a–7c. The overall setup of the device is the same as that shown in FIG. 1, except that lasers 1a–1c may now be different types of laser devices. The beams 1a'–1c' generated by the lasers 1a–1c may have different parameters, such as wavelength, pulse frequency, pulse duration, power, focal spot sizes at the working surface, etc. These parameters may be selected according in to the desired processes.

Figures 7A, 7B, 7C:
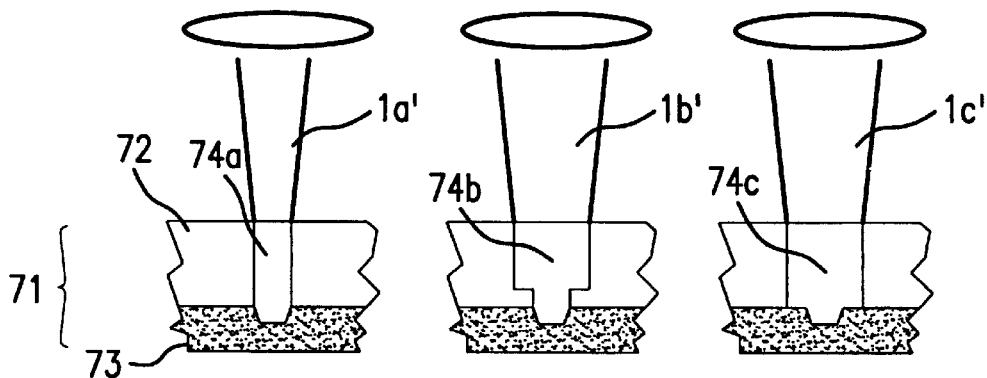
FIGS. 7a–7c show multiple processing steps according to the second embodiment of the present invention.

FIGS. 7a–7c illustrate forming a hole in a double layer 71 formed on the surface of a workpiece including an upper layer 72 and a lower layer 73. A laser beam 1a' from the first laser 1a (FIG. 1) having a relatively long wavelength and a narrowly focused beam spot is first applied to the double layer 71, opening a deep hole 74a through the upper layer 72 and partially reaching the lower layer 73. A slightly delayed second beam 1b' from the second laser 1b having a shorter wavelength is applied to the same spot on the workpiece to enlarge the hole 74a through a top portion of the upper layer 72 to form a hole 74b. A third beam 1c' slightly delayed from the second beam 1b' is then applied to the same spot on the workpiece. The third beam 1c', which has the same wavelength as the second beam, but is focused closer to or deeper into the double layer than the second beam, enlarges the hole through the entire upper layer 72, completing the three-step process.

As shown in FIG. 7c, the finished hole 74c has a deeper portion at the center and a shallower portion in the outer area. Thus, the method described above can be used to form holes with side walls having two or more progressively larger diameters, or tapered side walls. Tapered holes, especially when formed in relatively thick layers, may be advantageous in subsequent deposition steps to improve side coverage. This is because straight holes or trenches formed in thick layers often have steep and deep side walls, and in subsequent deposition steps such as contact formation, the evaporated metal often gives poor coverage of the side walls.

Figure 6A:
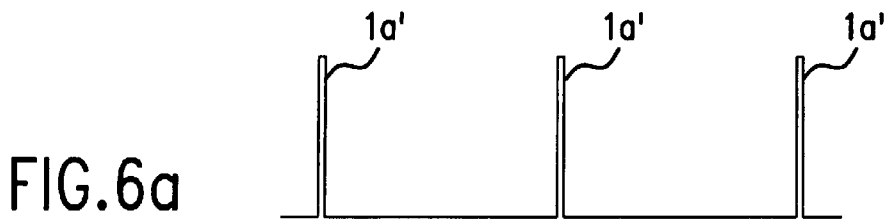
FIGS. 6a–6d illustrate the timing of the laser pulse sequences according to a second embodiment of the present invention.
Figure 6B:
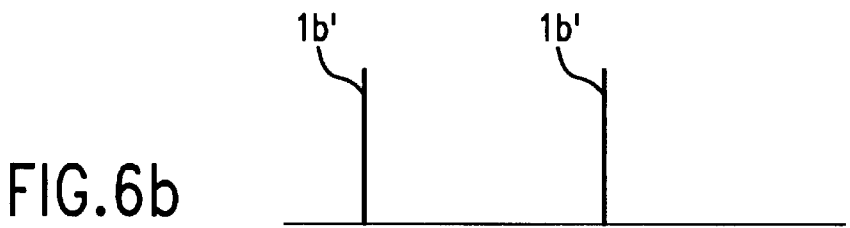
Figure 6C:
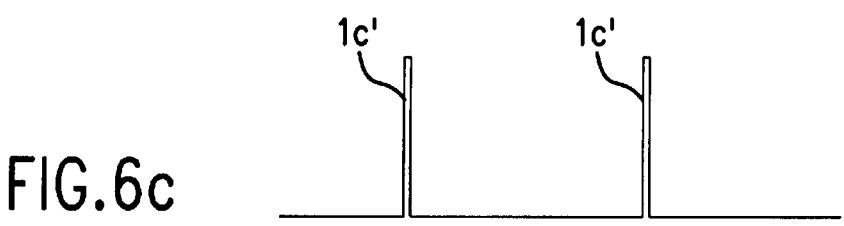
Figure 6D:
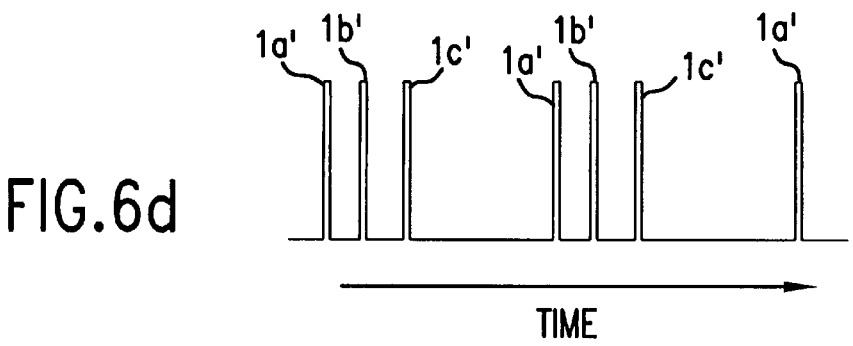

FIGS. 6a–6d illustrate the timing sequence for laser pulses for the above three-step process, where FIGS. 6a–6c show the pulse trains from the individual lasers 1a–1c, respectively, while FIG. 6d shows the combined pulse train seen at the work site. Preferably, the scanner 6 on which the workpiece is placed is synchronized with the triggering of the lasers so that the scanner is stationary during the group of three successive laser pulses 1a', 1b' and 1c', and moves to the next location before the next group of three laser pulses arrives.

This apparatus and method described above enable a multiple-step process to be accomplished in a single pass. While the fabrication of a hole is illustrated here, more complex multiple-step processes and trenching patterns can be accomplished in a single pass by controlling the relative motion of the workpiece and the laser beam, the types of the laser and the timing sequences.

Described below is a practical example of fabricating a thin film solar cell on a glass substrate using the single-pass multiple-step process according to the second embodiment of the present invention. Referring again to FIGS. 5a–5d, the method according to the second embodiment is similar to that of the first embodiment described earlier, except that the semiconductor layer 11 is now a poly-Si layer of about 10 µm in thickness, and the step corresponding to FIG. 5b now uses a single-pass, multiple-step method to form the isolation lines 12 in the poly-Si layer 11.

To form the isolation lines 12 in the poly-Si layer 11, two second harmonic Nd:YAG lasers were used in a two-step process. The laser pulse from the first laser had a spot size of about 100 μm at the work site, and removes about 4 μm of the poly-Si layer. The second laser pulse, delayed by about 10 μsec from the first pulse, had a slightly different focusing and the beam spot at the work site was about 80 μm. The semiconductor layer in the isolation lines 12 was completely removed by this single-pass, two-step process.

In the above embodiments, the number of lasers that can be used to generate the combined beam is theoretically limited by the duty ratio of the pulse trains of the laser beams, i.e., the ratio of the time period between the pulses and the duration of the pulses. Typically, if the laser pulse frequency is between 1–20 kHz, the laser pulses are fairly short, such as 200 nsec. Even when the pulse frequency is 20 kHz, it takes as long as 50 μsec to generate each pulse, which gives a duty ratio of 250. Thus, in this invention, the effective pulse frequency of the processing beam is only limited by the number of laser generators used. In addition, in most cases, it is more efficient to process the surface using relatively small laser spots. Because of the problems involved in the geometry of patterns to be processed, it is ideal to use the $TEM_{00}$ mode. These considerations are well understood in the art, and can be used advantageously in embodiments of the present invention as would be readily apparent to those skilled in the art.

Although specific application for this invention is described in the context of the fabrication of thin film solar cells, its application is by no means limited to the solar cell area.

It will be apparent to those skilled in the art that various modifications and variations can be made in a method of fabricating a thin film transistor of the present invention without departing from the spirit or scope of the inventions. Thus, it is intended that the present invention covers the modifications and variations of this invention provided they come within the scope of the appended claims and equivalents.

What is claimed is:

1. A laser processing method for processing a thin film formed on a surface of a workpiece, comprising:
    irradiating laser pulses on the thin film to at least partially remove the thin film from the surface of the workpiece, the laser pulses having wavelengths within the absorption range of the thin film, wherein the laser pulses are generated by a plurality of laser generators having Q-switches, wherein the laser pulses from the plurality of laser generators are directed by an optical system onto substantially the same spot on a plane defined by the surface of the workpiece, and wherein the Q-switches of the plurality of lasers are operated in a synchronized manner and the timing of the pulse generation of the plurality of lasers is adjustable relative to each other.

2. The method of claim 1, wherein the pulse frequencies of the plurality of laser generators are identical.

3. The method of claim 2, wherein the pulses from the plurality of laser generators are generated at the same time.

4. The method of claim 2, wherein the pulses generated by the plurality of laser generators are successively delayed from each other by an interval equal to the pulse period of the laser generators divided by the number of laser generators.

5. The method of claim 1, wherein the pulse frequencies of the plurality of lasers are integral multiples of a common frequency.

6. The method of claim 1, wherein the workpiece is moved relative to the optical system so that the point of irradiation on the workpiece by the successive laser pulses are displaced relative to each other in a processing direction.

7. The method of claim 1, wherein the laser pulses have pulse lengths of less than about 200 nsec.

8. The method of claim 1, wherein the pulses generated each laser generator has a pulse frequency between about 1 to 100 kHz.

9. The method of claim 1, wherein the laser generators generate laser pulses of the $TEM_{00}$ mode.

10. The method of claim 1, wherein the workpiece is a thin film solar cell device having a transparent substrate.

11. The method of claim 1, wherein the workpiece is a thin film solar cell device having a non-transparent substrate.

12. The method of claim 1, wherein the plurality of laser generators are of the same type.

13. The method of claim 1, wherein at least some of the plurality of laser generators are of different types.

14. The method of claim 13, wherein the wavelengths of the laser pulses generated by the different types of laser generators are different.

15. The method of claim 1, wherein the laser pulses from at least some of the plurality of laser generators are focused by the optical system at different distances from the surface of the workpiece.

16. An apparatus for processing a thin film formed on a surface of a workpiece, comprising:
    a plurality of laser generators having Q-switches for generating laser pulses;
    a Q-switch trigger device coupled to the laser generators for triggering the laser generators and controlling the timing of the pulse generation of the laser generators; and
    an optical system for directing the pulses generated by the plurality of laser generators onto substantially the same spot on a plane defined by the surface of the workpiece.

17. The apparatus of claim 16, wherein the optical system comprises a plurality of partial reflecting mirrors spaced from each other for reflecting the laser pulses generated the plurality of laser generators onto optical axes that substantially coincide with each other.

18. The apparatus of claim 16, wherein the optical system comprises a rotating mirror for alternately reflecting laser pulses generated by the plurality of laser generator onto optical axes that substantially coincide with each other.

19. The apparatus of claim 18, wherein the rotation of the rotating mirror is synchronized with the triggering of the laser generators.

20. The apparatus of claim 16, wherein the plurality of laser generators are of the same type.

21. The apparatus of claim 16, wherein at least some of the plurality of laser generators are of different types.

22. The apparatus of claim 21, wherein the wavelengths of the laser pulses generated by the different types of laser generators are different.

23. The apparatus of claim 16, wherein the optical system focuses the laser pulses from at least some of the plurality of laser generators at different distances from the surface of the workpiece.

* * * * *